US006864758B2

(12) United States Patent
Luen et al.

(10) Patent No.: US 6,864,758 B2
(45) Date of Patent: Mar. 8, 2005

(54) APPARATUS AND RESONANT CIRCUIT EMPLOYING A VARACTOR DIODE IN PARALLEL WITH A TRANSMISSION LINE AND METHOD THEREOF

(75) Inventors: Kong S. Luen, Germantown, MD (US); Philip Huang, North Potomac, MD (US); Robert Masucci, Potomac, MD (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/135,644

(22) Filed: Apr. 30, 2002

(65) Prior Publication Data

US 2003/0201843 A1 Oct. 30, 2003

(51) Int. Cl.[7] .................................................. H03H 7/38
(52) U.S. Cl. ............................ 333/35; 333/32; 333/203
(58) Field of Search .......................... 333/32, 35, 202, 333/203, 204, 205, 219, 235; 334/15

(56) References Cited

U.S. PATENT DOCUMENTS

| | | | | |
|---|---|---|---|---|
| 5,185,586 A | * | 2/1993 | Zucker | 331/96 |
| 5,231,361 A | * | 7/1993 | Smith et al. | 331/56 |
| 5,559,912 A | * | 9/1996 | Agahi et al. | 385/42 |
| 5,714,914 A | * | 2/1998 | Zhou | 331/117 R |
| 5,796,317 A | * | 8/1998 | Bohlman et al. | 333/127 |
| 5,856,713 A | * | 1/1999 | Huettner et al. | 307/125 |
| 5,905,414 A | * | 5/1999 | Motoi | 332/130 |
| 5,932,522 A | * | 8/1999 | Bell et al. | 505/210 |
| 6,057,741 A | * | 5/2000 | Alm | 331/117 D |
| 6,097,271 A | * | 8/2000 | Kozakoff | 333/204 |
| 6,177,872 B1 | * | 1/2001 | Kodukula et al. | 340/572.7 |

OTHER PUBLICATIONS

A Thin Film Type Magnetic/Dielectric Hybrid Transmission–Line with a Large Wavelength Shortening, Ikeda et al, IEEE vol. 37, No. 4, Jul. 2001.*

* cited by examiner

Primary Examiner—Timothy P. Callahan
Assistant Examiner—An T. Luu
(74) Attorney, Agent, or Firm—Toler, Larson & Abel, LLP

(57) ABSTRACT

A resonant circuit includes a transmission line in parallel with a varactor diode. The varactor diode has a capacitance that is variable in response to an applied voltage, which allows for real time impedance matching, attenuation control, and/or compensation for tolerances of other components. The resonant circuit is used with a quarter wavelength transmission line to provide impedance transformation and matching between multiple ports. A high frequency switch provides low current consumption, improved impedance matching, relatively low insertion losses, and excellent isolation between ports.

6 Claims, 2 Drawing Sheets

APPARATUS AND RESONANT CIRCUIT EMPLOYING A VARACTOR DIODE IN PARALLEL WITH A TRANSMISSION LINE AND METHOD THEREOF

FIELD OF THE DISCLOSURE

The present invention relates generally to resonant circuits and more particularly to resonant circuits employing varactor diodes.

BACKGROUND

Resonant circuits are often used for impedance matching in high frequency switching applications such as radio frequency (RF) switches. An example of one such RF switch is illustrated in prior art FIG. 1. RF switch 100 includes antenna port 120, transmitter port 110, and receiver port 130. In order to deliver a signal to be transmitted from transmitter port 110 to antenna port 120, a DC voltage is applied using voltage 198. The voltage is applied across bias resistor 195, through RF choke 190, through pin diode 150, on through quarter wavelength transmission line 170, and finally through pin diode 160 to ground. The DC current is prevented from entering ports 110 and 130 by blocking capacitors 180. When current flows through pin diode 160, one side of quarter wavelength transmission line 170 is effectively shorted to ground. Due to the properties of the quarter wavelength transmission line 170, the other side of quarter wavelength transmission line 170, which is not shorted to ground, is seen as an open circuit to a signal coming from transmitter port 110. In effect, the signal being transmitted from transmitter port 110 to antenna port 120 sees only the path between the two ports 110 and 120, and does not see the path to receiver port 130.

Conversely, when a signal received at antenna port 120 is to be delivered to a receiver connected to receiver port 130, voltage source 198 is turned off to stop the current flow through pin diodes 150 and 160. When no current flow through pin diode 150, pin diode 150 effectively acts as an open circuit, and so the signal received at antenna port 120 travels only along the path to receiver port 130. Note also that when no current flows through pin diode 160, which is coupled to one end of transmission line 170, the properties of quarter wavelength transmission line 170 are such that a signal having the proper frequency can travel through quarter wavelength transmission line 170 unhindered, as long as the impedance seen by the signal at port 130 matches the impedance seen by a signal of the same frequency at antenna port 120.

Matching networks 140 are used to try and match the impedance seen by a signal at antenna port 120 and the impedance seen by a signal at receive port 130. Under ideal conditions, matching networks 140 would be used to provide optimum power transfer from antenna port 120 to receiver port 130. In reality, however, matching networks 140 do not provide an exact impedance match between antenna ports 120 and receiver ports 130, and so there is signal loss across quarter wavelength transmission line 170, and maximum power is not transferred.

The imperfections in matching networks 140 arise in part due to unavoidable variations of component values used in constructing matching networks 140. In addition, when matching networks 140 are being designed initially, there comes a point where some particular component values for matching networks 140 must be decided upon and fixed. Variations in the values of other components, including pin diode 150 and pin diode 160, effectively change the resonant frequency of matching networks 140 so that the impedance match between antenna port 120 and receiver port 130 is somewhat degraded.

Another characteristic of prior art RF switch 100, one that makes RF switch 100 less desirable for use in mobile applications, is a large current draw. A property of pin diodes 150 and 160, and indeed pin diodes in general, is that the diodes' resistance and capacitance decrease as more current flows through them. Since it is desirable for pin diode 150 and pin diode 160 to have low resistance and capacitance values when turned on, it follows that a large amount of current must flow through pin diodes 150 and 160 to minimize signal losses due to high resistance, and to minimize impedance mismatches due to large capacitive values.

As should be apparent from the above discussion, currently available high frequency switches, and the matching networks used therein, could be improved. What is needed is a way to allow switching of high frequency signals between multiple ports that uses less current than the amount of current required by conventional pin diode switches such as prior art RF switch 100, and/or a way to provide more accurate impedance matching between different ports of a high frequency switch.

BRIEF DESCRIPTION OF THE DRAWINGS

Various display objects, advantages, features and characteristics of the present disclosure, as well as methods, operations and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

FIGS. 2 through 5 illustrate a resonant circuit and a high frequency switch in which the resonant circuit can be employed. By using a varactor in parallel with a short section of transmission line as a resonant circuit, the resonant frequency of the circuit can be altered by applying a voltage across the varactor diode. This allows the resonant frequency of the resonant circuit to be changed in order to perform real time impedance matching, and uses far less current than resonant circuits which rely upon pin diodes. In addition, the simplicity of construction of a resonant circuit according to at least one embodiment of the present invention allows for saving costs by requiring fewer components and by requiring less "real estate" when the resonant circuit is constructed as part of a semiconductor device. In addition to low current usage, at least one embodiment of the present invention can provide superior isolation as compared to pin diode switches, as well as lower insertion losses than some other high frequency switches.

Figure 1:
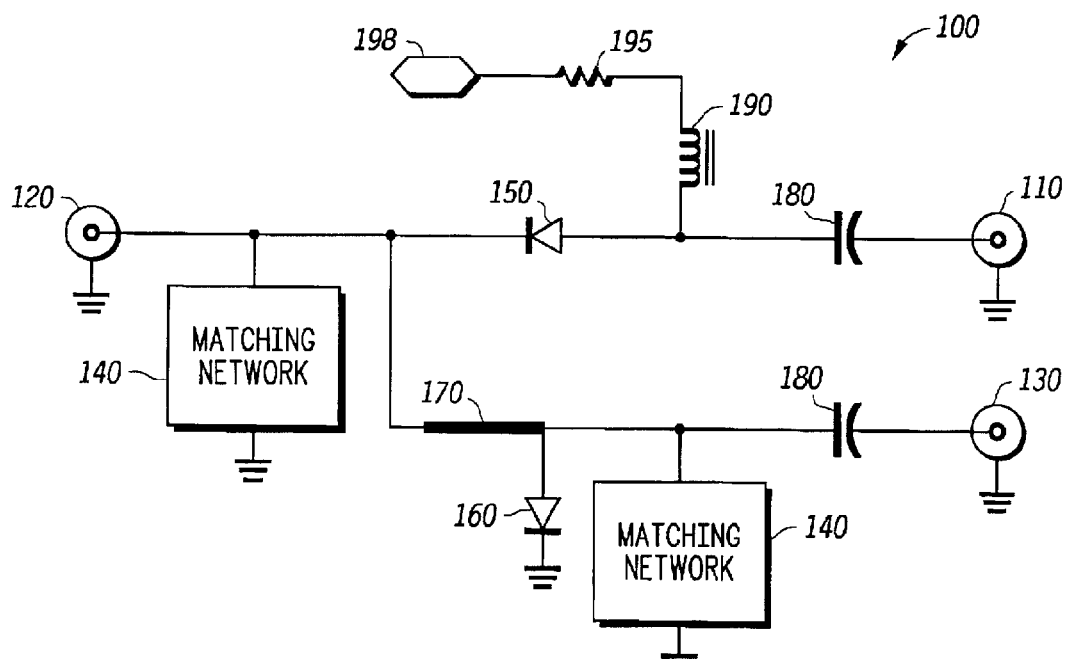
FIG. 1 is a schematic diagram of a prior art radio frequency switch.
Figure 2:
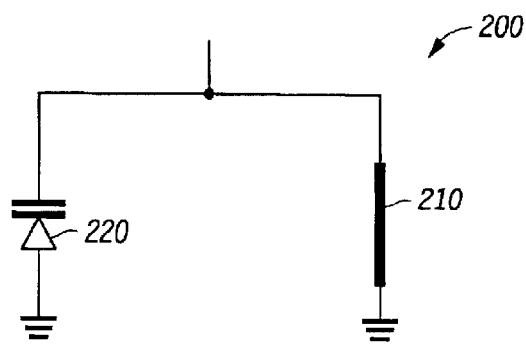
FIG. 2 is a resonant circuit employing a varactor diode and a short section of transmission line according to one embodiment of the present invention.

Referring now to FIG. 2, a resonant circuit according to one embodiment of the present invention will be discussed, and is designated generally as resonant circuit 200. In its simplest form, resonant circuit 200 includes varactor diode 220 in parallel with a short section of transmission line 210. As is known to those skilled in the art, the resonant frequency of a circuit is determined based on the reactive properties of the components in the circuit, namely the capacitance and inductance of the circuit components. The short section of transmission line 210 is short enough so that it can be modeled in a simple case as an inductor, and varactor 220 can be modeled as a capacitor.

In practice, the short section of transmission line 210 may be a microstrip formed on a printed circuit board (PCB), a trace formed in a silicon substrate, or some other form of wave-guide having a short length, for example about $\frac{1}{30}$ to $\frac{1}{40}$ the wavelength of a signal having a frequency the same as the desired resonant frequency of resonant circuit 200. It will be appreciated, however, that in calculating the proper transmission line length, various factors must be taken into account. For example, if a transmission line is constructed from coaxial cable, the diameter of the cable, the type and amount of shielding, the type and thickness of dielectric, and similar factors should all be accounted for, and may result in different transmission line lengths.

In one embodiment, for example, a signal of 2.4 GHz, is to be employed with a transmission line constructed on a printed circuit board using microstrip technology. Assume a signal of 2.4 GHz having a wavelength in free space of approximately 0.122 meters, and a transmission line having a dielectric constant of 4.5. Given these values, the length of the transmission line would be selected to be about 1.44 millimeters. To arrive at this result, the wavelength in free space of 0.122 meters was divided by 40, and then corrected for the dielectric constant by reducing the intermediate result by a factor of 1/square root of the dielectric constant of the transmission line. Depending on various parameters, other transmission lines may have a length determined by taking a different fraction of the wavelength in free space, for example $\frac{1}{30}$ instead of $\frac{1}{40}$, prior to correcting for the dielectric constant.

Varactor diode 220 is used to provide an adjustable capacitance to tune resonant circuit 200. A property of varactor diodes in general, including varactor diode 220, is that the capacitance value of the varactor diode varies according to a voltage applied across the varactor diode. By applying a particular DC voltage across varactor 220, the capacitance of varactor 220 can be controlled to allow the resonant frequency of resonant circuit 200 to be adjusted as desired. In combination then varactor diode 200 and transmission line 210 form an adjustable resonant circuit which can be used for impedance matching in a radio frequency switch, or other suitable applications. For example, resonant circuit 200 may be used in an attenuator, depending on how closely resonant circuit 200 is tuned to a desired frequency.

It will be appreciated that a resonant circuit such as resonant circuit 200 of FIG. 2 could be constructed on a silicon substrate, on a printed circuit board, or using entirely discrete components such as those that may be used for high power transmission lines and the like. The exact dimensions of transmission line 210 can be calculated using methods known to those skilled in the art to accommodate various signal frequencies as desired. Also, additional elements can be added to resonant circuit 200 as desired to provide a baseline resonant frequency, which could then be adjusted using varactor diode 220.

Figure 3:
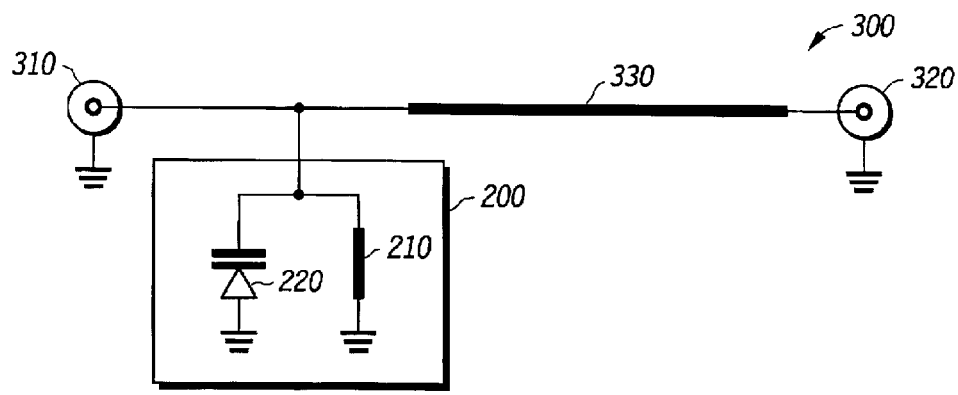
FIG. 3 is one leg of a radio frequency switch employing the resonant circuit illustrated in FIG. 2 according to one embodiment of the present invention.

Referring now to FIG. 3, a high frequency switch according to one embodiment of the present invention is illustrated, and designated generally as RF switch 300. RF switch 300 includes port 3 10 which may be, for example, a receiver port or a transmitter port; port 320 which may be, for example, an antenna port; quarter wavelength transmission line 330; and resonant circuit 200 which includes varactor diode 220 and transmission line 210 as discussed previously with regard to FIG. 2. Ports 310 and 320 each have an impedance which is chosen based on the impedance of the circuitry or equipment to be connected through ports 310 and 320. For example, if port 310 is a transmitter port, the impedance of port 310 may be chosen to be 50 ohms. This means that any transmitter connected to port 310 will have an impedance of 50. In addition, assume that port 320 has an impedance of 50 ohms and is designed to be connected to a 50 ohm antenna. In order to ensure maximum power transfer between a transmitter (not shown) connected to port 310, and an antenna (not shown) connected to port 320, the antenna should have the same impedance as the impedance of the transmitter. Matching impedances in this way ensures that maximum power transfer occurs from port 310 to port 320.

In operation, RF switch 300 connects or disconnects ports 310 and 320 depending on a DC voltage applied to varactor diode 220, as discussed subsequently. When port 310 is connected to port 320, quarter wavelength transmission line 330 matches the impedance of port 310 to the impedance of port 320. When port 310 is disconnected from port 320, quarter wavelength transmission line 330 acts as an open circuit.

First, the open circuit condition of RF switch 300 in which port 310 is electrically disconnected from port 320 will be discussed. In order to electrically disconnect port 310 from port 320 a DC voltage is applied to varactor diode 220 to vary the capacitance of varactor diode 220 so that when varactor diode 220 is placed in parallel with the inductance provided by transmission line 210, resonant circuit 200 will have a resonant frequency that is different from the frequency at which RF switch 300 is designed to operate. By tuning resonant circuit 200 to a frequency significantly different from the operating frequency of RF switch 300, resonant circuit 200 presents a low impedance to a signal at port 310. For example, suppose that a signal of 2.4 GHz is received on an antenna connected to port 320, and further assume that a transmitter is connected to port 310. Assume that in this example, it is undesirable to have the signal received at port 320 pass through to port 310, and so resonant circuit 200 is tuned to have a resonant frequency different than 2.4 GHz. When resonant circuit 200 is tuned, by applying a DC voltage to varactor 220, to have a resonant frequency sufficiently different from 2.4 GHz, any signal of 2.4 GHz would pass through resonant circuit 200 to ground. In effect, a signal of 2.4 GHz that happened to be present at port 310 would be presented with a low impedance.

It is a characteristic of quarter wavelength transmission lines in general, and quarter wavelength transmission line 330 in particular, that a very low impedance on one end of the transmission line would be transformed to a very high impedance at the other end of the transmission line. Therefore, by de-tuning resonant circuit 200 (making the resonant frequency different than 2.4 GHz) the signal at port 320 sees a very high impedance. It will be appreciated that the low impedance referred to is ideally 0 ohms and the high impedance is ideally infinite, but in practice the ideal low and high impedances may not be achieved. It will be appreciated by those skilled in the art that generally an impedance value of only a few ohms can be effectively ignored, and it can be assumed for modeling purposes that resonant circuit 200 provides a direct short to ground. The high impedance seen by the 2.4 GHz signal at port 320 is generally in the range of 300 k ohms to 500 k ohms, but the value is not so limited. In practice, the 300 K ohms to 500 K ohms can generally be considered an open circuit, so that almost no signal from port 320 will reach port 310 when resonant circuit 200 is de-tuned.

Consider now an example of when it is desirable to electrically couple port 310 to port 320. Assume again, that port 310 is connected to a transmitter (not shown) and port 320 is connected to an antenna (not shown), and both the transmitter and the antenna have nominal impedances of 50 ohms. A property of quarter wavelength transmission line 330 is that, at its operating frequency, a 50 ohm impedance on one side of quarter wavelength transmission line 330 will be transformed into the exactly the same 50 ohm impedance at the other side of quarter wavelength transmission line 330. It will be appreciated that while 50 ohms is used in this example, if port 310 and 320 were designed to be connected to 75 ohm equipment, 100 ohm equipment, or any other equipment having a suitable impedance, quarter wavelength transmission line 330 could be designed to transform 75 ohms to 75 ohms, 100 ohms to 100 ohms, and so on, rather than the 50 ohm to 50 ohm transformation used in this example.

The problem, then, becomes how to make the impedance presented to a signal at port 310 equal to 50 ohms. In order to do this, a voltage is applied to varactor 220 in order to tune resonant circuit 200 to the frequency at which RF switch 300 is designed to operate. By tuning resonant circuit 200, a signal at the operating frequency of RF switch 300 will see resonant circuit 200 as an open circuit, and therefore will no see a low impedance to ground. As a result, the only impedance present at port 310 will be the impedance of the connected equipment, which is 50 ohms in this example. Quarter wavelength transmission line 330 transforms the 50 ohms at port 310 into 50 ohms at port 320, which effectively matches the impedances of ports 310 and 320 so that maximum power transfer can occur.

One of the great advantages of using resonant circuit 200, as described in various embodiments herein, is that the voltages applied to varactor 220 can be used to compensate for imperfections in other portions of RF switch 300, which may otherwise have shifted the resonant frequency of resonant circuit 200, thereby decreasing its effectiveness in "switching" RF switch 300 into open and/or closed states. The isolation loss of a switch as discussed herein, has been measured at between −16 and −20 DB. In addition, since no unnecessary components are in the signal path from port 310 to port 320, insertion losses of 1 DB or less have been obtained.

In other embodiments, RF switch 300 may be used as an attenuator, so that only a desired portion of a signal is transferred from port 310 to port 320. by applying various voltage levels to varactor diode 220, the resonant frequency of resonant circuit 200 can be adjusted to a point in between the low and high impedance states, so that an intermediate level of impedance is presented to a signal at port 310. This intermediate level of impedance can be adjusted to cause quarter wavelength transmission line 330 to provide various levels of impedance matching and corresponding attenuation.

Figure 4:
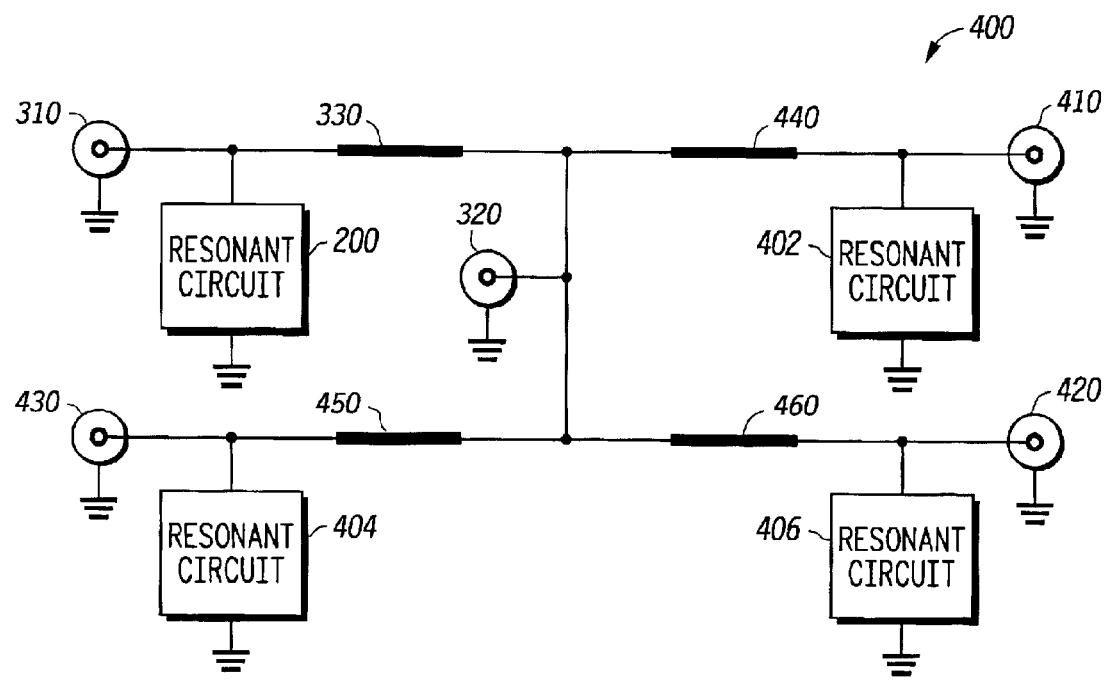
FIG. 4 is a schematic diagram of a single antenna port being shared by a plurality of transmitting and sending devices through a switch configuration according to one embodiment of the present invention.

Referring next to FIG. 4 a multi-switch configuration employing a plurality of high frequency switches such as RF switch 300 is illustrated, and designed generally as switch configuration 400. Switch configuration 400 illustrates one way in which multiple high frequency switches can be used to route signals to a single antenna. Note that while antenna-transmitter-receiver configurations are illustrated and discussed in FIG. 4, multiple high frequency switch configuration 400 can be employed in other suitable applications as desired. In the illustrated embodiment, ports 310 and 430 are transmitter ports, port 320 is an antenna port, and ports 410 and 420 are receiver ports. For purposes of this discussion it is assumed that all equipment connected to ports 310, 320, 410, 420, and 430 has a nominal impedance of 50 ohms. However, as discussed earlier other impedance values may be used without departing from the spirit and scope of the present invention.

Assume that first it is desired to transmit from a transmitter (not shown) connected to port 310 through an antenna (not shown) connected to port 320. In that case, resonant circuit 200 would be tuned to the operating frequency of transmitter 310, and resonant circuit 402, 404, and 406 would all be de-tuned to have a resonant frequency different from the operating frequency of the transmitter (not shown) connected to port 310. Configuring multiple switch configuration 400 in this manner would allow the transmitter connected to port 310 to deliver a signal to antenna port 320 with minimal signal loss.

Assume that next it was desired to receive a signal from the antenna connected to port 320 using a receiver connected to port 410. First, the transmitter (not shown) connected to port 310 would stop transmitting. Next, resonant circuit 200 connected to port 310 would be de-tuned from the operating frequency of multiple switch configuration 400. By de-tuning resonant circuit 200, the impedance seen on the side of quarter wavelength transmission line 330 which is connected to antenna port 320 is effectively equivalent to an open circuit, thereby disconnecting port 310 from port 320. Resonant circuit 402 could then be tuned to the operating frequency of multiple switch configuration 400, so that only the impedance of the receiver (not shown) connected to port 410 would be seen on one side of quarter wavelength transmission line 440. Quarter wavelength transmission line 440 would then transform the 50 ohm impedance on the side connected to port 410 into the same 50 ohms on the side connected to port 320. In this way the antenna connected to port 320 is impedance matched to the receiver connected to port 410. Resonant circuits 404 and 406 remain de-tuned, thereby ensuring that quarter wavelength transmission lines 450 and 460 present a high impedance, to port 320. By tuning and de-tuning resonant circuits 200, 402, 404, and 406, various ports can be connected to port 320.

Figure 5:
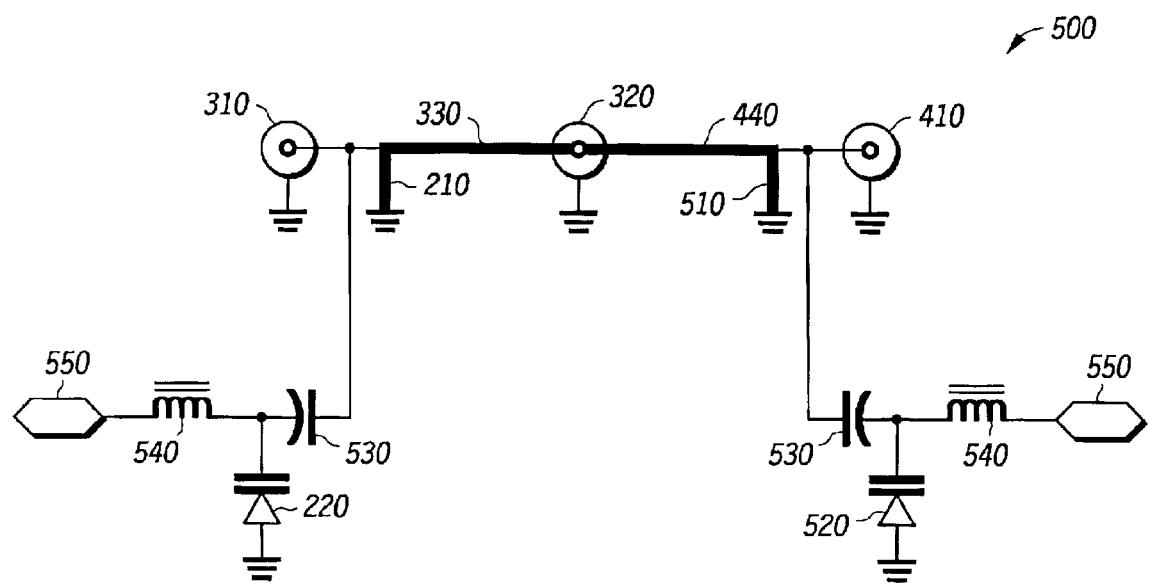
FIG. 5 is a schematic diagram of an RF switch which allows a receiver and a transmitter to use the same antenna according to one embodiment of the present invention.

Refer now to FIG. 5, in which a particular embodiment of a high frequency switch is discussed according to one embodiment of the present invention. High frequency switch 500, includes transmitter port 310, antenna port 320, and receiver port 410. One side of antenna port 320 is connected to quarter wavelength transmission line 330 which is in turn connected to transmission line 210. Varactor diode 220 is connected to transmitter port 310 through blocking capacitor 530, and into DC source 550 through RF choke 540. Note that varactor diode 220 and transmission line 210 are in parallel with each other as discussed previously, except that blocking capacitor 530 is included to block any current from DC source 550. On the other side of antenna port 320 are quarter wavelength transmission line 400, transmission line 510, blocking capacitor 530, RF choke 540, DC source 550, and varactor diode 520. Note that varactor diode 520 and transmission line 510 are in parallel with each other.

The capacitance of varactor diode 220 can be varied by applying a voltage across varactor diode 220. An advantage of using a device such as varactor diode 220 which has a capacitance that varies with voltage rather than a device, such as a pin diode, which has a capacitance that varies with current is that current and power requirements are generally lower. DC source 550 is used to provide this voltage, and thereby control the capacitance of varactor diode 220. RF chokes 540 are used to provide isolation between DC supply 550 and RF switch 500. As mention earlier, capacitors 530 are used to isolate DC source 550 from RF switch 500, except for providing a control voltage through varactor diode 220.

In operation, high frequency switch 500 works as previously described herein. A DC voltage is applied to varactor diode 220 to adjust the capacitance of varactor diode 220 and thereby tune the resonant circuit formed by transmission line 210 and varactor diode 220. When it is desired to disconnect port 310 from port 320, the resonant circuit is tuned away from the operating frequency of high frequency switch 500. When it is desired to connect port 310 to port 320 and provide appropriate impedance matching, the resonant frequency of the resonant circuit is tuned to match the operating frequency of switch 500.

The portion of high frequency switch 500 used to connect or disconnect port 410 from port 320 functions the same way as that portion of the switch used to connect or disconnect port 310 to port 320. It should be noted that by limiting the application of the DC voltage provided by DC source 550 to varactors 220 and 520, the amount of current needed for proper functioning of high frequency switch 500 is kept to a minimum.

In the preceding detailed description of the figures reference has been made to the accompanying drawings which form a part thereof and in which is shown by way of illustration specific embodiments in which the invention may be practiced. These embodiments are described in sufficient detail to enable those skilled in the art to practice the invention, and it is to be understood that other embodiments may be utilized and that logical, mechanical, chemical and electrical changes may be made without departing from the spirit or scope of the invention. For example, reference has been made to "ground." Those skilled in the art will appreciate that the term "ground" may refer to an earth ground, a circuit ground, a zero voltage level, or merely a voltage level that is common to a number of circuit elements. In addition, various electrical components have been discussed without referring specifically to their value. Those skilled in the art will appreciate that specific values for various components may be varied to achieve various design, manufacturing, or other constraints, and selection of appropriate component values is well within the knowledge of those skilled in the art.

To avoid detail not necessary to enable those skilled in the art to practice the invention, the description may omit certain information known to those skilled in the art. Furthermore, may other varied embodiment that incorporate the teachings of the invention may be easily constructed by those skilled in the art. Accordingly, the present disclosure is not intended to be limited to the specific form set forth herein, but on the contrary, it is intended to cover such alternatives, modifications, and equivalents as can reasonably be included within the spirit and scope of the invention. The preceding detailed description is therefore not to be taken in a limiting sense, and the scope of the present disclosure is defined only by the appended claims.

What is claimed is:

1. An apparatus comprising:
   a plurality of ports;
   a first quarter-wavelength transmission line comprising a first end electrically coupled to a first port of said plurality of ports and a second end electrically coupled to a second port of said plurality of ports;
   a first resonant circuit electrically coupled from said first port to ground, said first resonant circuit comprising:
      a first varactor diode having a capacitance variable in response to an applied voltage; and
      a first transmission line in parallel with said first varactor diode;
   a second quarter-wavelength transmission line comprising a first end electrically coupled to a third port of said plurality of ports and a second end electrically coupled to said second port;
   a second resonant circuit electrically coupled from said third port to ground, said second resonant circuit comprising:
      a second varactor diode having a capacitance variable in response to an applied voltage; and
      a second transmission line in parallel with said second varactor diode;
   a third quarter-wavelength transmission line comprising a first end electrically coupled to a fourth port of said plurality of ports and a second end electrically coupled to said second port;
   a third resonant circuit coupled from said fourth port to ground, said third resonant circuit comprising:
      a third varactor diode having a capacitance capable of being varied in response to an applied voltage; and
      a third transmission line in parallel with said third varactor diode.

2. A method comprising: applying a first voltage to a first varactor diode in parallel with a first transmission line, wherein:
   the first varactor diode and the first transmission line form a first resonant circuit having a first resonant frequency;
   the first resonant circuit is electrically coupled in parallel with a first port having an impedance; and wherein
   the first resonant frequency is such that the first resonant circuit presents a high impedance to a signal at the first port having a desired resonant frequency;
   matching the impedance of the first port to the impedance of a second port using a first quarter-wavelength transmission line electrically coupled from the first port to the second port;
   applying a second voltage to a second varactor diode in parallel with a second transmission line, wherein:
      the second varactor diode and the second transmission line form a second resonant circuit having a second resonant frequency;
      the second resonant circuit is electrically coupled in parallel with a third port having a characteristic impedance; and wherein
      the second resonant frequency is such that a signal at the third port having the desired resonant frequency is presented with a low impedance; and
   transforming the low impedance at the third port to a high impedance at the second port using a second quarter-wave transmission line electrically coupled from the second port to the third port.

3. The method as in claim 2, further comprising:

adjusting the first voltage applied to the first varactor diode to change the first resonant frequency of the first resonant circuit, such that the first resonant circuit presents a low impedance to a signal at the first port having the desired resonant frequency;

transforming the low impedance at the first port to a high impedance at the second port using the first quarter-wave transmission line;

adjusting the second voltage applied to the second varactor diode to change the second resonant frequency of the second resonant circuit such that the second resonant circuit presents a high impedance to a signal at the third port having the desired resonant frequency; and matching the impedance of the third port to the impedance of the second port using the second quarter-wavelength transmission line.

4. The method as in claim 2, further comprising:

applying a third voltage to a third varactor diode in parallel with a third transmission line, wherein:
  the third varactor diode and the third transmission line form a third resonant circuit having a third resonant frequency;
  the third resonant circuit is electrically coupled In parallel with a fourth port having a impedance; and wherein
  the third resonant frequency is such that the third resonant circuit presents a low impedance to a signal at the fourth port having the desired resonant frequency; and transforming the low impedance at the fourth port to a high impedance at the second port using a third quarter-wave transmission line electrically coupled from the second port to the fourth port.

5. The method as in claim 4, further comprising:

adjusting the first voltage applied to the first varactor diode to change the first resonant frequency of the first resonant circuit, such that the first resonant circuit presents a low impedance to a signal at the first port having the desired resonant frequency;

transforming the low impedance at the first port to a high impedance at the second port using the first quarter-wave transmission line;

adjusting the third voltage applied to the third varactor diode to change the third resonant frequency of the third resonant circuit such that the third resonant circuit presents a high impedance to a signal at the fourth port having the desired resonant frequency; and matching the impedance of the fourth port to the characteristic of the second port using the third quarter-wavelength transmission line.

6. The method as in claim 5, further comprising:

adjusting the third voltage applied to the third varactor diode to change the third resonant frequency of the third resonant circuit, such that the third resonant circuit presents a low impedance to a signal at the fourth port having the desired resonant frequency;

transforming the low impedance at the fourth port to a high impedance at the second port using the third quarter-wave transmission line;

adjusting the second voltage applied to the second varactor diode to change the second resonant frequency of the second resonant circuit such that the second resonant circuit presents a high impedance to a signal at the third port having the desired resonant frequency; and matching the impedance of the third port to the impedance of the second port using the second quarter-wavelength transmission line.

* * * * *